United States Patent [19]

Bert et al.

[11] Patent Number: 4,617,528
[45] Date of Patent: Oct. 14, 1986

[54] COMPACT COMBINER FOR USE WITH SEMICONDUCTOR DEVICES IN THE MICROWAVE FREQUENCY RANGE

[75] Inventors: Alain Bert, Gif sur Yvette; Narguise Mamodaly, Paris, both of France

[73] Assignee: Thomson CSF, Paris, France

[21] Appl. No.: 536,393

[22] Filed: Sep. 27, 1983

[30] Foreign Application Priority Data

Sep. 28, 1982 [FR] France ................. 82 16296

[51] Int. Cl.⁴ ..................... H01B 1/00; H01P 5/12
[52] U.S. Cl. .................. 331/56; 331/107 SL; 331/107 P; 333/247; 333/128
[58] Field of Search ............ 333/128, 127, 136, 117, 333/120, 100, 104, 247, 246, 137, 219; 331/107 SL, 107 P, 56, 99; 330/295, 286, 287, 53

[56] References Cited

U.S. PATENT DOCUMENTS

| | | | |
|---|---|---|---|
| 3,617,945 | 11/1971 | Nakahara et al. | 333/1.1 |
| 3,701,049 | 10/1972 | Van Iperen et al. | 331/107 P |
| 4,127,830 | 11/1978 | Chalifour et al. | 333/104 |
| 4,297,722 | 10/1981 | Nagahama et al. | 333/247 X |
| 4,323,855 | 4/1982 | Gerlach | 333/128 X |
| 4,328,471 | 5/1982 | Quine | 333/128 |

FOREIGN PATENT DOCUMENTS

2048528 10/1969 Fed. Rep. of Germany .
2213619 8/1974 France .

OTHER PUBLICATIONS

Wolff, I; "Einführung in die Mikrostrip-Leitungstechnik", vol. 1, mai 1974, Eigenverlag, Duisberg, Die Leitungen, pp. 29–53.

Wolff I; "Einführung in die Mikrostrip-Leitungstechnik", vol. 2, mai 1974, Eigenverlag, Duisburg, Technologie und Bauelemente, pp. 1–11.

Conference Proceedings, 9th European Microwave Conference, 17–20 Sep. 1979, Brighton G. B.; Y. Archambault, "The Distributed Oscillator: A Solution for Power GaAs IMPATT Combining".

IEEE Transactions on Microwave Theory & Techniques: vol. MTT 29, #7, Jul. 1981, pp. 642–654 and vol. MTT 30 #2, Feb. 1982, pp. 163–173.

Electronic Transmission Technology; Lines, Waves and Antennas by William Sinnema; Published by Prentice Hall, Inc., 1979; pp. 16–17.

*Primary Examiner*—Eugene R. LaRoche
*Assistant Examiner*—Benny Lee
*Attorney, Agent, or Firm*—Cushman, Darby & Cushman

[57] ABSTRACT

A metallic support supports a number of semi-conductor devices surrounded by an annular dielectric substrate which in turn supports a circuit including at least two microstrip lines and a metallic circular output element. The small thickness and high dielectric constant of the substrate are selected to permit a reduction in width and in length of the microstrip lines which are folded-back in a curvelinear fashion and placed on the substrate along circular arcs which are concentric with the output element.

14 Claims, 9 Drawing Figures

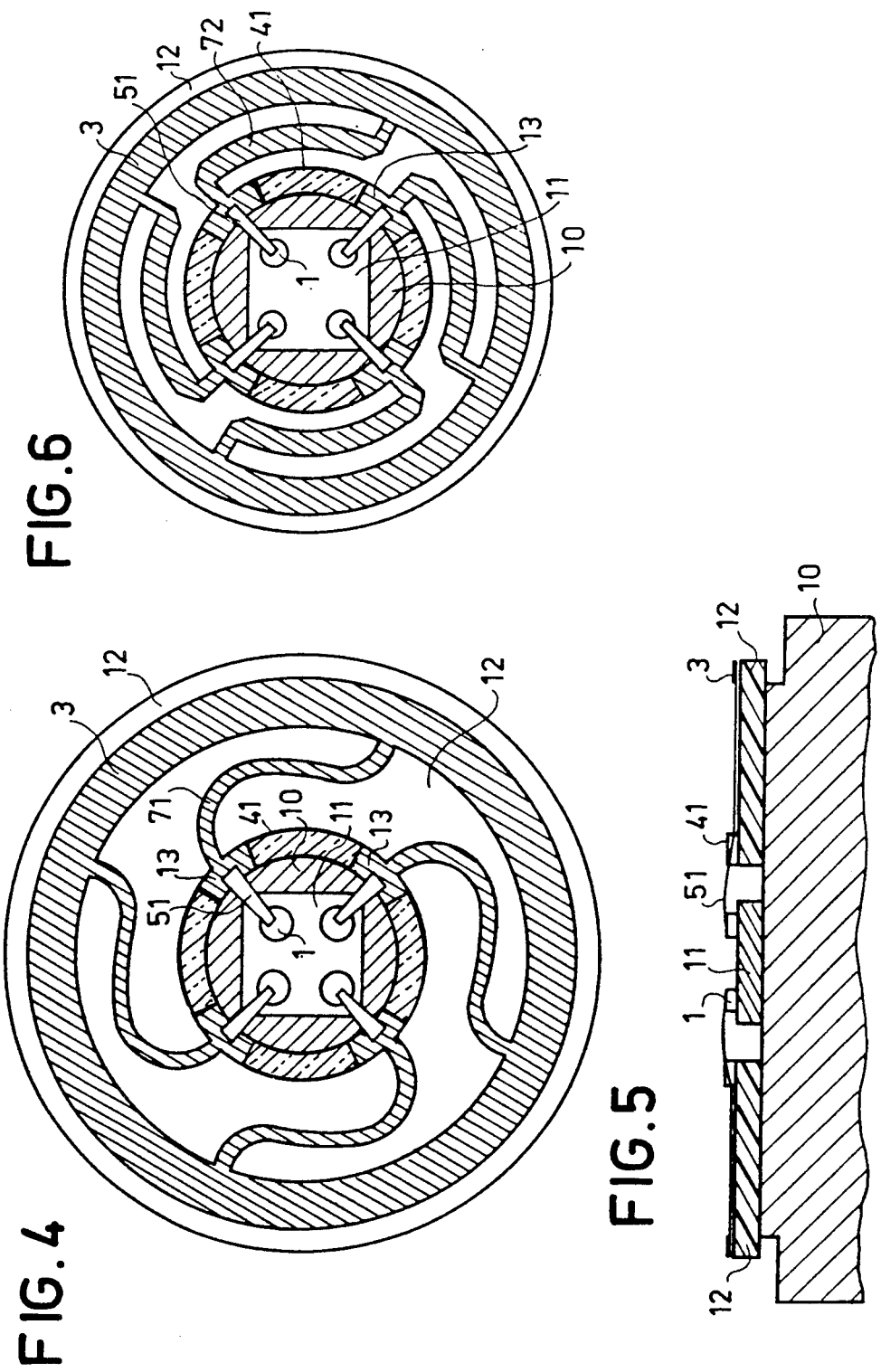

COMPACT COMBINER FOR USE WITH SEMICONDUCTOR DEVICES IN THE MICROWAVE FREQUENCY RANGE

BACKGROUND OF THE INVENTION

This invention relates to a compact combiner for use with semiconductor devices in the microwave frequency range. Said combiner incorporates a plurality of semiconductor chips on a single wafer and comprises an impedance-matching and balancing circuit arranged on a dielectric substrate chosen for reducing the dimensions of impedance-matching microstrip, thus making it possible to produce a combiner of compact design. Furthermore, the substrate material which supports the microstrips can be chosen so as to ensure that the combiner exhibits very low sensitivity to temperature variations.

The invention will be explained in the case of a diode combiner since this simplifies both the description and the figures but the application of the combiner to other semiconductor devices such as microwave transistors follows from the arrangement shown with diodes in the accompanying drawings.

The invention provides the answer to a double problem which is specific to microwave devices, namely the power problem and the problem of dimensional requirements.

SUMMARY OF THE INVENTION

In accordance with present concepts, high power outputs attaining several mean watts and several tens of peak watts, as required for long-distance transmission at microwave frequencies, are at present achieved in regard to solid state components by means of diodes such as avalanche diodes and in some instances by means of Gunn diodes. Since the requisite power values can be obtained only from a single semiconductor chip, it proves necessary to resort to the use of a plurality of chips. Several possibilities are accordingly open to choice:
   association of a plurality of diodes within a casing such as the Kurokawa-type combiner,
   association of a plurality of chips within the casing,
   combination of the two methods just mentioned.

So far as the chip is concerned, it is not possible to produce a very substantial increase in the junction surface of the diode. In order to maintain efficient performance, it would be necessary to increase the bias current. This would result in heating of the diode since the junction temperature of the diode is proportional to the product of the total thermal resistance times the power applied to the diode, and the thermal resistance does not decrease by one-half when the junction surface is doubled. The curves of efficiency as a function of temperature exhibit a threshold above which the efficiency decreases. Furthermore, if the junction surface is increased, the impedance of the diode decreases and impedance-matching of the diode is thus made more difficult. In consequence, the most advantageous solution existing at the present time for obtaining power in the microwave frequency bands consists in associating a plurality of elementary chips and in making them operate under their optimum conditions.

In regard to the dimensions of the combiner, the problem is related to the existence of commercially available supports or seats which conform to the standards accepted by equipment manufacturers. A new component mounted on a support which is interchangeable with another support already in existence is more advantageous for the user than the same component mounted on a newly designed support or a support which has been modified on the user's premises. In point of fact, microwave devices which radiate energy are usually employed in an environment which requires that the support on which a new component is mounted should be adapted to pre-existing equipment such as waveguides or connecting members. This is one of the reasons which led to the construction of a combiner in accordance with the invention on a support initially designed for mounting a single diode or a single semiconductor chip. It is possible to mount a plurality of chips on one support by reason of the very small dimensions of chips designed for microwave frequencies. The difficulty with this approach lies in the fact that mere connection of several chips in parallel or in series does not permit good addition of power. In order to overcome this difficulty, it is necessary to construct circuits comprising impedance-matching microstrip lines, the length of which usually prompts the need for a support of large size.

However, the characteristics of suspended microstrip lines establish a relation between their length, their width, their thickness and the dielectric constant of the substrate which supports them. It is by modifying the thickness and the dielectric constant of the substrate that the invention makes it possible to adapt the dimensions of the microstrip lines in width and/or in length and thus makes it possible to fold them back in a curvelinear path in order to place them concentrically with the semiconductor chips on the seat of the combiner.

In more specific terms, the invention relates to a compact combiner for use with semiconductor devices in the microwave frequency range and comprising a metallic support or seat on which is mounted both a plurality of semiconductor devices and a dielectric substrate which has the shape of a ring and surrounds the semiconductor devices and supports a circuit which includes at least two microstrip lines and a ring-shaped metallic combining output element. Each microstrip line is joined at a first end to a semiconductor device by means of a metallic connection and is joined at a second end to the output element. The distinctive feature of the combiner lies in the fact that the thickness of the substrate and the high dielectric constant $\epsilon$ of the constituent material of the substrate are chosen with a view to reducing the width and the length of the microstrip lines which are folded-back in a curvelinear fashion and placed on the substrate along circular arcs which are concentric with the output element.

BRIEF DESCRIPTION OF THE DRAWINGS

Other features of the invention will be more apparent upon consideration of the following description and accompanying drawings, wherein:

FIG. 4 is a plan view of a combiner in accordance with a first embodiment of the invention;

FIG. 5 is a sectional view of the combiner of the preceding figure;

FIG. 6 is a plan view of a combiner in accordance with a second embodiment of the invention;

DESCRIPTION OF THE SPECIFIC EMBODIMENTS

As stated earlier, the invention will be explained with reference to the case of a diode combiner but is more generally applicable to other semiconductors such as transistors, for example.

Figure 1:
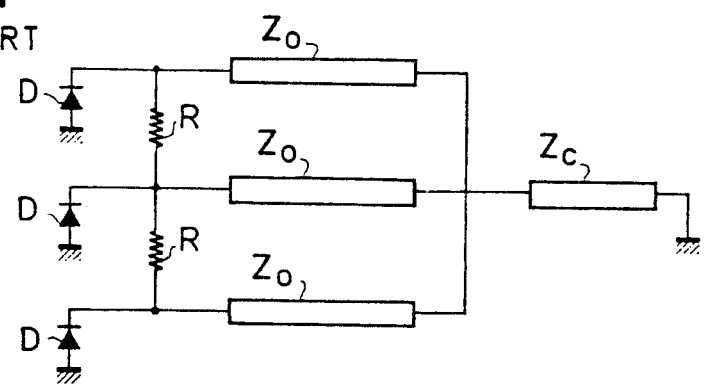
FIG. 1 is an electric circuit diagram of the combiner assembly in accordance with the prior art and the present invention.

Thus FIG. 1 is an electric circuit diagram of the combiner assembly in accordance with the prior art and the present invention. This arrangement is already known and has been described in one form of topology in French patent Application No. 79 087 90 filed by the present Applicant on Apr. 6th, 1979. In accordance with this electric circuit diagram, the requisite power is obtained by connecting in parallel a plurality of diodes D which deliver the power to a useful load $Z_C$ via an impedance microstrip line $Z_0$ which comprises an impedance-matching device, one microstrip line $Z_0$ being provided for each diode D. Ballast resistors R, mounted between the diodes or the impedances $Z_0$, serve to balance the assembly. In a symmetrical propagation mode, the behavior of this assembly is the same as would be the case of an assembly in which it is postulated that "n" diodes D are mounted in parallel with all their anodes connected to each other and with all their cathodes connected to each other, and which would deliver its energy to a load $Z_C$ via a single microstrip line having an impedance $Z_0/n$. From a knowledge of the load impedance $Z_C$ and of the impedance Z of each diode, it is possible to determine the characteristic impedance of the microstrip line $Z_0$ having a wavelength $\lambda/4$, where $\lambda$ is the wavelength of oscillation of the system, in order to convert a low impedance to a high impedance.

This electric circuit arrangement can be produced in different ways. A first embodiment is described in the patent Application cited earlier. A second embodiment is illustrated in FIG. 2.

Figure 2:
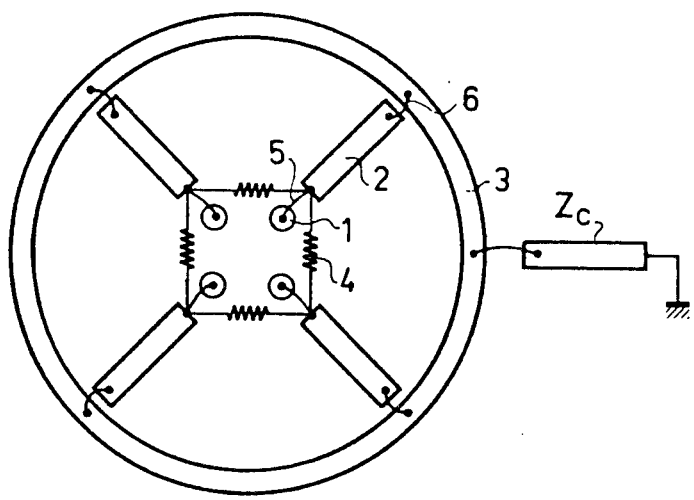
FIG. 2 is a diagrammatic plan view of the combiner in accordance with the prior art.

FIG. 2 shows only those parts which are strictly necessary in order to gain a clear understanding of the description and is a plan view of a combiner in accordance with the prior art. In order to simplify and limit the figure, the combiner comprises only four diode chips. Each diode chip 1 is connected to an impedance-matching microstrip 2 and the assembly consisting of the microstrip lines 2 is connected to a metallization element 3 which short-circuits said lines with respect to each other. The ballast resistors R are fabricated in the form of resistive deposits 4 which interconnect the microstrips 2 at their ends located nearest the diode chips 1. Connections by means of wires or preferably metallic strips serve at 5 to connect each diode chip to the microstrip line 2 which is associated with it, and serve at 6 to connect the same microstrip line to the output element 3 on which the output energy is collected.

This plan view (in which the substrates and dielectrics required for the fabrication process have been omitted) represents a circular topology. It is apparent from this figure that, in order to associate a plurality of diodes 1 which can be fabricated on a single semiconductor crystal of very small size, it is necessary to have a relatively large available space by reason of the length of the microstrip lines 2. In fact, the impedance of a suspended microstrip 2 is related to its width and the dielectric constant as well as to the thickness of the dielectric substrate which carries said microstrip. Furthermore, suspended microstrips usually take the form of rectangles having a relatively substantial width but also a fairly substantial length. Thus a star arrangement as shown in FIG. 2 is not advantageous from the point of view of the area which is occupied by the combiner and which is too large to mount a combiner of this type on a support designed for only a single diode.

Figure 3:
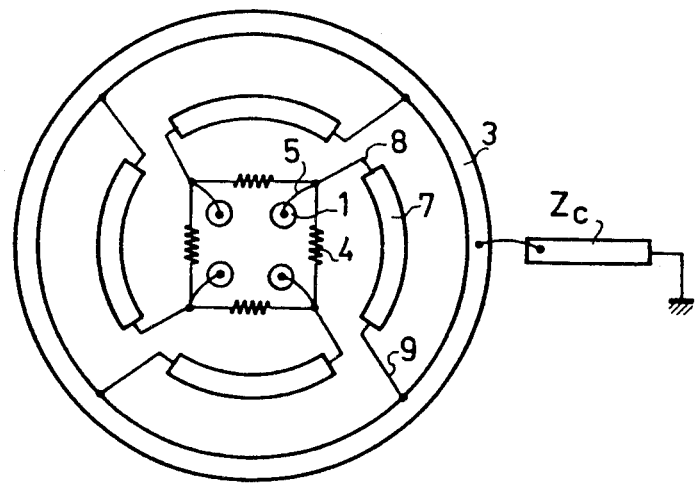
FIG. 3 is a diagrammatic plan view of a combiner in accordance with the invention (in the case of diodes)

FIG. 3 is a plan view of a combiner in accordance with the invention. This simplified diagram shows how the combiner is arranged so that the microstrip lines are no longer radial but concentric with the circular seat or support device. As was the case in FIG. 2, FIG. 3 illustrates only those elements which are necessary for the following explanations. Thus the metallic seat as well as the substrate which supports the device are not shown in FIG. 3.

In the topology which is contemplated by the invention, only the central portion of the device has been retained. In this portion, a plurality of diodes such as the diode 1 are grouped together. Said diodes are connected to each other via ballast resistors 4 and joined to the microstrip corresponding to each diode by means of an electrical connection 5. The metallic output element 3, on which the energy of the combiner is collected, has also been retained. The basic concept of the invention consists in folding-back the microstrips in a curvelinear fashion so as to concentrate the combiner as a whole within a smaller area. A radial microstrip 2 (as was shown in FIG. 2) is replaced in accordance with the invention by a microstrip line 7 which is concentric with the device as a whole. The microstrip line 7 is connected at one end to the corresponding diode by means of a lead 8 and is connected at the other end to the output metallization element 3 by means of a lead 9.

Two means serve to ensure that the microstrip lines occupy a smaller area on the substrate and consequently result in a combiner of compact design.

A first means is shown in FIG. 4, which is a plan view of a combiner in accordance with a first embodiment of the invention. As was the case with the preceding figures, this figure is simplified as far as possible in order to provide a clearer illustration which is in any case completed by the sectional view of FIG. 5.

The combiner in accordance with the invention comprises a metallic support 10 which is used both for mechanical attachment of the device and for removal of heat, the following components being fixed on support 10: a pedestal 11 on which are fixed the plurality of semiconductor devices such as the device 1. It should also be mentioned that the pedestal 11 can consist of a piece of crystal in which all the semiconductor devices 1 form a monolithic structure. The pedestal may also constitute what is known by those skilled in the art as an integrated radiator or, in other words, a metallic deposit usually consisting of gold and formed on the entire semiconductor disk prior to formation of the chips 1 by collective chemical etching followed by a cutting-out operation; a ring-shaped dielectric substrate 12 surrounding the substrate 11 which carries the semiconductor devices. The inner periphery of the dielectric substrate 12 is provided with a plurality of metallization contacts such as the contact 13, one contact being located directly opposite to each diode 1. The metallization contacts 13 are joined together in pairs by means of a resistive deposit 41 which corresponds to the resistors 4 of FIG. 3. The outer periphery of the dielectric substrate 12 carries a circular metallic output element 3 on which the energy of the combiner is collected. Each diode 1 is joined to the corresponding metallization contact 13 by means of a connecting member 51 which preferably consists of a metallic strip.

Between each metallization contact 13 and one point of the outer metallization element 3 are developed microstrip lines 71, the geometry of which will be explained hereinafter.

The impedance $Z_0$ of a line such as a microstrip 71 is essentially a function of the ratio H/W, where W is the width of the line and H is the height or thickness of the dielectric substrate which supports said line. If W is small with respect to $\lambda_g/4$, where $\lambda_g$ is the propagation wavelength of a microstrip line deposited on the substrate, the line may accordingly be folded-back in a curvelinear fashion, as is depicted in FIG. 4. In order to obtain this result, a dielectric substrate 12 having a very small value of thickness is employed. Typically, the thickness H is of the order of: $H < \lambda_g/40$. In the case of alumina having a dielectric constant $\epsilon$ in the vicinity of 10 with $\lambda = 5.76$ mm at 20 GHz, the length of the line $\lambda_g/4 = 1.44$ mm and the thickness of the dielectric support 12 is smaller than 0.144 mm.

This makes it possible to obtain microstrip lines which are narrow in comparison to their length and consequently makes it possible, as shown in FIG. 4, to foldback said microstrip lines 71 in a curvelinear fashion and to make them partially concentric rather than totally radial. The result thereby achieved is a reduction in overall size of the combiner device. In the event that each microstrip line 71 is folded-back in a curvelinear fashion, one end of the microstrip line begins directly at the metallization contact 13 whilst the other end of said line terminates directly at the etched circular output element 3.

Another means for compacting a combiner consists, not in modifying the width of the microstrip line in order to permit folding-back the microstrip line in a curvelinear fashion, as discussed above, but in modifying its geometrical length as shown in FIG. 6. This figure is a plan view of a combiner in accordance with a second embodiment of the invention.

A plurality of semiconductor devices 1 as shown in FIG. 6 are supported by a pedestal 11 which can also be a piece of monolithic crystal or else an integrated radiator comprising semiconductor devices which may be formed simultaneously with the integrated radiator. Said pedestal 11 is fixed on the metallic support 10 of the combiner and is surrounded by a dielectric substrate disk 12. As in the case of FIG. 4, metallization deposits 13 and resistive deposits 41 are formed on the inner edge of the disk 12, two metallization deposits 13 being connected together by means of each resistive deposit 41. Again in the same manner, each semiconductor device 1 is connected to a metallization deposit 13 by means of a metallic strip 51.

In the foregoing, the chips 1 are usually formed of silicon or of gallium arsenide. The assembly consisting of chips and dielectric disk 12 can result from an entirely monolithic construction in which the disk 12 is of silicon or of GaAs having very high resistivity.

However, in regard to the microstrip lines 72, the length of these lines can be reduced while retaining the same characteristic impedance by modifying the nature of the dielectric substrate 12 which is selected in order to have a high dielectric constant $\epsilon$. Whereas the dielectric constant $\epsilon$ is of the order of 3.8 in the case of quartz or of the order of 10 in the case of alumina, the microstrip line 72 is considerably shorter if the material chosen has a dielectric constant $\epsilon$ on the order of 40. In this case, said microstrip line is disposed concentrically with respect to the device as a whole.

Apart from dielectric substances having high dielectric constants $\epsilon$, there exist a number of compositions having a base of titanate with an extremely low temperature coefficient. Barium titanate $Ba_2Ti_9O_{20}$ has a dielectric constant within the range of 35 to 40 but the use of this material is attended by difficulties related to the presence of a hygroscopic phase which has the effect of impairing performances in the long term. Zirconium titanate $ZrTiO_4$ doped with tin also has a dielectric constant within the range of 35 to 40 and a loss tangent of the order of $10^{-4}$ to 5 GHz. The application of this material to the fabrication of temperature-stable dielectric resonators has already been disclosed in patent Application No. 80 04 601 of Feb. 29th, 1981 by the present Applicant.

The variation in dielectric constant as a function of temperature is primarily dependent on the nature of the chemical bond. In the case of materials having high dielectric constants and therefore having ionic bonds, this variation is essentially the result of a volume effect. Expansion of the solid produces a reduction in the number of elementary dipoles per unit volume. In the case of zirconium titanate, the coefficient of linear expansion is small and the variation in dielectric constant as a function of temperature is even more abnormally small, namely on the order of $-100$ ppm per degree centigrade, as compared to $-200$ ppm per degree centigrade for prior art dielectrics. It is also known that partial doping with tin or zinc makes it possible to reduce the variation in the dielectric constant as a function of temperature to zero.

Apart from doping with tin, various dopants such as nickel oxide or lanthanum oxide in particular make it possible to modify the variation in dielectric constant as a function of temperature as well as the preparation techniques. Finally, the addition of traces of iron has a beneficial effect on variations in losses as a function of the composition.

Thus it is possible, in the case of materials such as zirconium titanate partially doped with tin to modify the characteristics of the material as a function of temperature and to compensate for frequency variations of an oscillator when the dielectric substrate undergoes a temperature rise. For example, at each turnon of the oscillator, a composition of this type makes it possible to prevent the so-called "chirp" phenomenon or variations in the frequencies emitted by the combiner. The use of zirconium titanate partially doped with tin therefore makes it possible, not only to produce shorter microstrip lines, although they have the same impedance, but also to stabilize the oscillator as a function of temperature variations.

Figure 7:
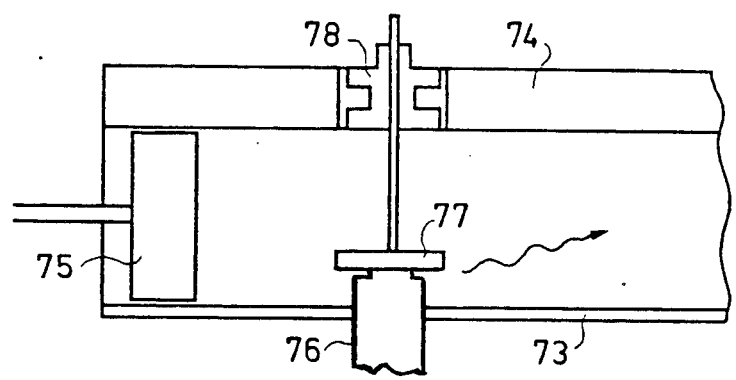
FIG. 7 is a sectional view of a combiner in accordance with the invention and mounted in a waveguide.
Figure 8:
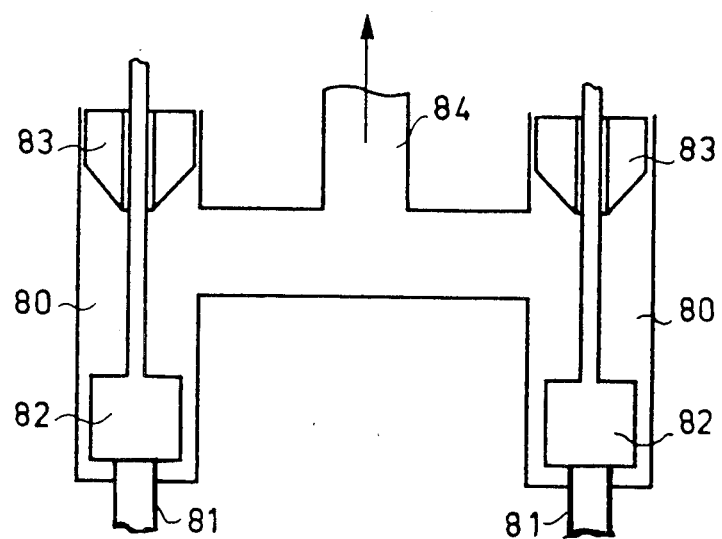
FIG. 8 is a sectional view of a combiner in accordance with the invention mounted in a Kurokawa assembly.

FIGS. 7 and 8 are two sectional views showing the utilization of the combiner in accordance with the invention. However, these two examples of utilization do not constitute any limitation in the scope of the invention.

In FIG. 7, a combiner 76 in accordance with the invention is mounted within a waveguide formed by side walls 73 and 74 and by a movable short-circuit 75 which is intended to adjust the waveguide distance $\lambda_g/4$, between short-circuit 75 and multidiode module 76. The combiner is polarized by means of a radiating plate 77 to which the polarization is applied via a trap 78 designated as a $\lambda/4$ trap. The advantage of the combiner in accordance with the invention lies in the fact that, in the case of one and the same support 76, the power available and radiated within the waveguide is greater although the mechanical device is identical with that of a single diode mounted on the same support.

FIG. 8 illustrates a second case of load impedance on a plurality of combiners 81 in accordance with the invention in a Kurokawa assembly, which makes it possible to add the powers of a plurality of multidiode modules in accordance with the invention. In such a Kurokawa-type assembly, each combiner 81 in accordance with the invention is connected to an impedance transformer 82 and to a coaxial cable having a central rod which is coupled magnetically to a cavity 80 and passes through an absorbent 83 for applying the polarization to the diodes. The total amount of energies emitted by the plurality of combiners 81 is collected on the common output 84.

Figure 9:
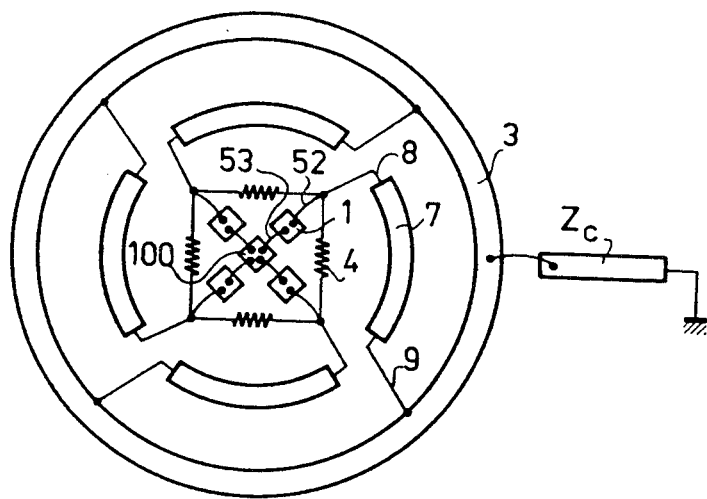
FIG. 9 is a diagrammatic plan view of a combiner in accordance with the invention as applied to transistors.

FIG. 9 is a plan diagram of a combiner in accordance with the invention in which the semiconductor chips are transistors or, in a very general sense, field-effect transistors at the high frequencies considered. For the sake of comparison, a parallel can be drawn between this figure (9) and FIG. 3 which considered the case of a diode combiner.

If the transistors 1 have a structure such that their drain is constituted by their substrate, the transistors are mounted in a common drain connection whenever a plurality of transistors are soldered on the same metallic pedestal (not shown in FIG. 9). The sources of said transistors are connected by means of a metallic strip 52 to a microstrip 7 which is folded-back in accordance with the invention, and the transistor gates are connected by means of a strip 53 to a capacitor 100 which is common to all the transistors. The value of the capacitor 100 establishes the oscillation frequency of the device but oscillation takes place only if the combiner has a suitable output impedance. The impedance level to be restored is usually different from that which is necessary for diodes but the invention remains applicable in its basic principle.

The circuit operates without any need to bias the transistor gates. It is only necessary to bias the sources at a negative potential applied to the outer metallic element 3 and to connect the drains to ground.

The construction of a transistor combiner in accordance with FIG. 9 can have the configuration of FIG. 4 or of FIG. 6. In these figures, the diode chips can readily be replaced by transistor chips and a single capacitor can be readily implanted at the center of the chips.

The number of semiconductors illustrated in the figures or the types of semiconductors (Gunn diode, avalanche diode, field-effect transistor mounted in a common drain connection) are not to be considered as implying any limitation in the scope of the invention as defined by the appended claims.

What is claimed is:

1. A compact combiner, comprising: a metallic support member; an annular dielectric substrate with a hole in the middle, mounted on said support member;
   a plurality of semiconductor devices mounted within said hole;
   a ring-shaped metallic output element mounted on the periphery of said dielectric substrate; and
   a plurality of curvelinear microstrip lines mounted on said dielectric substrate, each said microstrip line having a length and a width and a first end which is coupled to a respective one of said semiconductor devices and a second end which is coupled to said output element,
   wherein said dielectric substrate has a thickness H which is selected so as to reduce the width of said each microstrip line.

2. A combiner according to claim 1 wherein said thickness H is less than $\lambda_g/40$, where $\lambda_g$ is a propagation wavelength of one of said plurality of microstrip lines.

3. A combiner according to claim 1 wherein said dielectric substrate has a dielectric constant $\epsilon$ which is selected so as to reduce the length of each said microstrip line.

4. A combiner according to claim 3 wherein said thickness H is less than $\lambda_g/40$, where $\lambda_g$ is a propagation wavelength of one of said plurality of microstrip lines, and wherein said dielectric constant $\epsilon$ is greater than 35.

5. A combiner according to claim 3 wherein said plurality of semiconductor devices comprise a plurality of transistors, each transistor having a drain which is grounded through said substrate and a source which is connected to one of said microstrip lines and is biased by a negative potential applied to said output element, each said transistors having a gate which is non-biased and is connected to a capacitor common to all said transistors, the common capacitor being located at substantially the center of said substrate.

6. A compact combiner according to claim 3, wherein said semiconductor devices include diodes.

7. A compact combiner according to claim 3 wherein said plurality of semiconductor devices include a plurality of transistors, each transistor having first and second electrodes, said first electrode being connected to one of said microstrip lines, said second electrode being loaded by an impedance.

8. A compact combiner according to claim 3, wherein said dielectric substrate is made of semiconductor material having very high resistivity to allow for monolithic integration.

9. A compact combiner according to claim 3, wherein said dielectric substrate includes zirconium titanate partially doped with tin.

10. A compact combiner according to claim 9, wherein traces of nickel oxide NiO and of lanthanum oxide $La_2O_3$ are added to said tin doped zirconium titanate in amounts which produce a dielectric substrate having a dielectric constant $\epsilon$ which varies as a function of temperature so that oscillation frequency drifts of said combiner which are caused by temperature variations may be compensated for.

11. A compact combiner, comprising:
    a metallic support member;
    an annular dielectric substrate with a hole in the middle, mounted on said support member;
    a plurality of semiconductor devices mounted within said hole;
    a ring-shaped metallic output element mounted on the periphery of said dielectric substrate; and a plurality of curvelinear-microstrip lines mounted on said dielectric substrate, each said microstrip line having a length and a width and a first end which is coupled to a respective one of said semiconductor devices and a second end which is coupled to said output element, wherein said dielectric substrate has a dielectric constant $\epsilon$ which is selected so as to reduce the length of each said microstrip line.

12. A combiner according to claim 11 wherein said dielectric constant $\epsilon$ is greater than 35.

13. A compact combiner according to claim 11, wherein said dielectric substrate includes zirconium titanate partially doped with tin and having a dielectric constant $\epsilon = 36$.

14. A compact combiner according to claim 13, wherein traces of nickel oxide NiO and of lanthanum oxide $La_2O_3$ are added to said tin doped zirconium titanate in amounts which produce dielectric substrate having a dielectric constant which varies as a function of temperature so that oscillation frequency drifts of said combiner which are caused by temperature variations may be compensated for.

* * * * *